United States Patent
Bores et al.

(10) Patent No.: US 6,550,619 B2
(45) Date of Patent: Apr. 22, 2003

(54) SHOCK RESISTANT VARIABLE LOAD TOLERANT WAFER SHIPPER

(75) Inventors: Gregory W. Bores, Prior Lake, MN (US); Michael C. Zabka, Barron, WI (US); Ralph Henderer, Minneapolis, MN (US)

(73) Assignee: Entergris, Inc., Chaska, MN (US)

( * ) Notice: Subject to any disclaimer, the term of this patent is extended or adjusted under 35 U.S.C. 154(b) by 0 days.

(21) Appl. No.: 09/851,499

(22) Filed: May 8, 2001

(65) Prior Publication Data

US 2002/0014435 A1 Feb. 7, 2002

Related U.S. Application Data

(60) Provisional application No. 60/202,585, filed on May 9, 2000, and provisional application No. 60/217,656, filed on Jul. 10, 2000.

(51) Int. Cl.[7] .............................................. B65D 85/48
(52) U.S. Cl. ...................................... 206/710; 206/303
(58) Field of Search ................................. 206/449, 454, 206/303, 710, 711, 712, 722; 211/41.18; 118/500

(56) References Cited

U.S. PATENT DOCUMENTS

| | | | |
|---|---|---|---|
| 3,552,548 A | 1/1971 | Wallestad et al. ............... 206/1 |
| 3,850,296 A | 11/1974 | Hirata et al. ................. 206/334 |
| 4,135,625 A | 1/1979 | Merrill ........................ 206/445 |
| 4,817,799 A | 4/1989 | Gregerson et al. .......... 206/445 |
| 4,886,162 A | 12/1989 | Ambrogio ................... 206/328 |
| 5,211,717 A | 5/1993 | Skoura ........................ 206/328 |
| 5,284,802 A | 2/1994 | Muraoka et al. ............. 437/225 |
| 5,366,079 A | 11/1994 | Lin et al. ..................... 206/328 |
| 5,402,890 A | 4/1995 | Yajima et al. ............... 206/451 |
| 5,454,468 A | 10/1995 | Chou et al. .................. 206/303 |
| 5,474,177 A | 12/1995 | Abrams et al. .............. 206/710 |
| 5,553,711 A | 9/1996 | Lin et al. ..................... 206/710 |
| 5,724,748 A | 3/1998 | Brooks et al. .................. 34/90 |
| 6,193,090 B1 * | 2/2001 | Connors et al. ............. 206/394 |
| 6,198,068 B1 * | 3/2001 | Lindstrom ............. 219/121.45 |
| 6,286,684 B1 * | 9/2001 | Brooks et al. ............... 206/303 |

OTHER PUBLICATIONS

Internation Search Report PCT/US01/15020 Sep. 19, 2001.*

* cited by examiner

Primary Examiner—David T. Fidei
(74) Attorney, Agent, or Firm—Patterson Thuente Skaar & Christensen, P.A.

(57) ABSTRACT

A wafer shipper for stacked wafers provides significantly improved resistance to shock and impact as well as flexibility and tolerance in wafer capacities and guidance in optimal amount of packing material. The shipper has a base and a top cover both of which have a nominal wall that primarily forms all of the features of the respective components. The base has four sides, four corners, and arcuate wall segments defining a wafer stack pocket. The sides are formed of a downwardly extending nominal wall portion and an upwardly extending lip. Both adjoin a nominal wall defining a planar surface that extends around the base and forms a seat for the top cover. The planar surface adjoins the arcuate wall segments and also adjoins the floor of the wafer stack pocket that is also part of the nominal wall. Impact forces that are received on the corners and/or sides of the top cover are transferred to the base through the top cover to upright portions on the opposite side of the base from where the impact occurs providing a significant improvement in the robustness of the container as well as significant improvement in the protection provided to the wafers, as well as much better resistance to unlatching upon such impact. The invention further includes a mold for a wafer carrier utilizing separate inserts for converting from a first size pocket to a second size pocket. Suitably sized blanks may be inserted in said slots when the mold is to be used for the first size wafer carrier and the blanks may be removed when the mold is utilized for the second size.

21 Claims, 10 Drawing Sheets

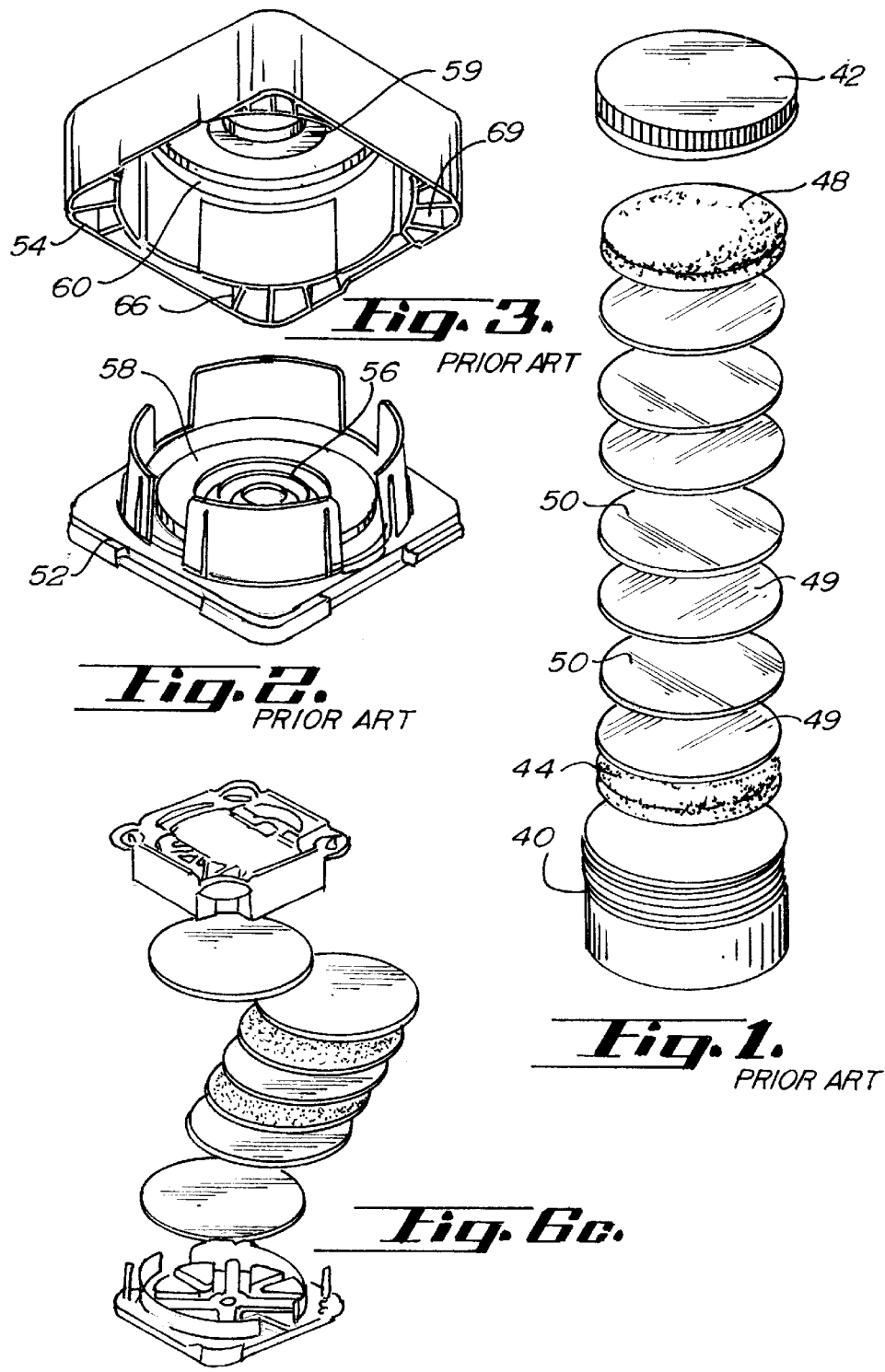

SHOCK RESISTANT VARIABLE LOAD TOLERANT WAFER SHIPPER

RELATED APPLICATIONS

This Application claims priority to U.S. Provisional Patent Application No. 60/202,585, filed May 9, 2000, and to U.S. Provisional Patent Application No. 60/217,656, filed Jul. 10, 2000. Both provisional patent applications are hereby incorporated herein by reference.

BACKGROUND OF THE INVENTION

Integrated circuits are manufactured from semiconductor wafers that are conventionally round in shape and made of highly brittle silicon. Such wafers are subjected to a variety of processing steps in transforming the semiconductor wafer into integrated circuit components. The various processing steps must be performed under ultra-clean conditions to minimize the potential of contamination of the wafers as they are being processed. Each wafer may be subjected to dozens if not hundreds of steps in its processing cycle. The potential for contamination and destruction of a wafer or reduction in yield is ever present throughout the various processing and packaging steps. Particularly during the steps that take place at fabrication facilities any minute particulates can destroy the integrated circuit on which it falls. Once the processing steps of the wafers are completed they are generally shipped while still in wafer form to a facility that will dice and capsulate in integrated circuit packaging each individual circuit on the wafer.

The stringent particulate control that takes place during the processing steps is generally not necessary in shipping the completed wafers to the facility that dices and packages the individual circuits.

Traditionally, during the processing and storage and shipping of semiconductor wafers the wafers are supported and constrained at their edges to prevent any contact and possible damage and contamination to the faces of the wafers having the circuits thereon.

Even as semiconductor wafers are getting larger in scale, now up to 300 millimeters in diameter, the density of components is getting significantly greater. Moreover, disks are also are getting thinner providing much thinner completed integrated circuit packages. This has been driven, at least in part, by the cellular phone industry that has sought thinner cell phones.

Accompanying the trend towards larger, more dense and thinner wafers, the wafers are becoming more valuable, more brittle, more easily damaged during shipment. Although it is possible, desirable, and common to ship thicker wafers in enclosed containers that would support the wafers exclusively by their edges, using such devices to ship the thinner wafers has proven problematic due to breakage and damage of the wafers. Foam material, such as urethane, is used to cushion the top and bottom of the stack.

Thus for the thinner more fragile wafers, enclosures utilized which have the wafers axially stacked on top of one another and separated by layers of paper-like flexible sheet material. Thus the support of each wafer is by adjacent wafers and the entire stack of wafers.

Referring to FIG. 1, prior art wafer carrier as illustrated in U.S. Pat. No. 5,553,711 to Lin discloses a container that has a base, upright sidewalls defining a circular pocket, wafer dividers and a cover that comes down and threadingly attaches to the base.

FIG. 2 discloses a conventional wafer carrier in which the enclosure is defined by a cookie tin like plastic container having a bottom 40, a top lid 42 and utilizing a circular urethane foam bottom cushion 44, and sheet material 49 interspersed between wafer 50.

Referring to FIGS. 2 and 3, another wafer shipper is disclosed for shipping the stacked wafers with dividers therebetween. This wafer shipper has a base 52 and a top cover 54. The base and top cover are injection molded and have circular shaped and axially extending structural members 56, 58 in the base component. Similarly, the top cover has axially extending circular structural members 59 and 60 and radially extending ribs 66, 69 that also project axially.

These stacking wafer shippers may be both manually handled as well as robotically handled. Thus, means for opening and closing such containers must be both manually and robotically operable and for manual purposes should be intuitive as well as simple, reliable, and quick. Various means are known for latching such wafer shippers. These include threads such as shown in prior art FIG. 1, a snap-on seal as shown in prior art FIG. 2, a minimal rotation thread, and axially projecting spring latches.

The wafer shippers that use the threaded engagements are awkward and subject to misalignment and improper attachment. These wafer shippers visually appear symmetrical in at least two planes and therefore there are typically four different options in assembling a top cover to a bottom cover. However, conventional prior art shippers generally require that the top cover be assembled in a specific orientation for proper latching.

U.S. Pat. No. 6,193,068 to Lewis, et al. discloses axially extending spring latches and utilizes a double wall to define the pocket for the stack of wafer carriers. Said double wall thickness is defined by two spaced thin wall sections which are not attached to one another extending from the base. This configuration appears to allow the individual unsupported thin walls supported only at the base to take on and retain deformation. The concentric arrangement of the thin walls makes any such deformation visibility apparent. The double sidewall in this prior art embodiment may help to isolate direct impact on the top cover from direct communication from top cover structure to the wall defining the wafer pocket.

In the embodiment shown in FIGS. 7, 8, 9, and 10, any separation stress will occur as illustrated by G in FIG. 11. Such loading of the wafer shipper also can cause the deformation of the otherwise planar corners of the base to be stressed out of position causing wobbling when placed on a planar surface and error in seating when placed on a machine interface. Such deformation can be caused in part by an overloading condition and also in part by the structural configuration of the wafer shipper.

It would be desirable to provide sufficient structure in the base of such wafer shipper to prevent such distortion and bowing. Moreover, it would be highly desirable to provide a wafer carrier that has indicating means therein to prevent such an overloaded condition.

Referring to FIGS. 12, 13, 14, and 15 a further prior art wafer shipper is shown. This wafer shipper has stunted threads 82, 84 that allow the wafer carrier to be rotated less than 30° to accomplish the latching. This wafer carrier has the difficultly of requiring relatively precise angular positioning for initial placement of the top cover on the base before said rotation.

This embodiment utilizes axially projecting double thin wall similar to the prior art embodiment of FIGS. 8, 9 and 10, although the double sidewalls are connected at the ends of each segment. Thus, four separate wall portions are defined all of which are distinct from one another and integral with the base. Due to the connecting portions 94 which connect each of the pairs of thin sidewall segments, a direct impact blow on the top cover will transmit the force of such blow directly from the top cover through said connecting portions 94 to the wafers. This top cover also has features configured as nubs, which may engage a floppy disk. See FIG. 16 that is a cross-sectional of the wall at one of said nubs.

Generally all embodiments of the wafer carriers herein will be injection molded of thermoplastic material such as polypropylene. Such material requires structure such as ribs and channels for rigidity.

In that these shippers do not have the severe particulate control issues that are necessary for carriers in the fab processing environment, it is not necessary to have hermetic sealing. In fact, such hermetic sealing is inimical to robotic handling and easy manual handling, specifically the opening and closing of the shippers. Still it is important to have the interface between the top cover and the base to provide as good of sealing characteristics as possible. Moreover, it is important to eliminate or reduce any bowing that occurs along one of the sidewalls intermediate the corners of the top cover or the base.

These types of containers may be utilized once and thrown away or may be recycled and utilized multiple times. Although the product shipped in such containers can be of immense value, it is still important to reduce the manufacturing cost of the shippers to as great as extent as possible, consistent with the other necessary characteristics.

A most important characteristic of such wafer shippers for stackable wafers is that the shippers provide protection from damage due to shock during the transportation. This shock may consist of direct impact with the shipper's top cover or base or consist of jarring of the entire shipper package. In either case it is important to provide protection from damage to the wafers packed therein.

Moreover, it is important that such wafer shippers provide latching means of high integrity that do not inadvertently open during shipment or handling, for example when a shipper is inadvertently dropped.

Such shippers are typically drop tested to determine the overall integrity of the shipper. Upon such dropping, unlatching, breakage of the shipper or damage to the wafers constitutes a failure. The impact during dropping, including drop testing, creates shear, compressive and torsional forces on the shipper components. The shipper, including the latches must withstand combinations of these forces when loaded.

These wafer carriers rely heavily upon the separation of materials between wafers, which may be polyethylene sheet material with carbon providing a static dissipative characteristic, polyurethane foam, or other suitable flexible thin sheet material. Typically the packing material placed on the bottom and top of the stack will be the polyurethane foam that is compressible. The compressibility of the foam facilitates packing a variable number of wafers in a particular shipper which can leave some undesirable discretion to the packer as to how many wafers and/or how much padding material is appropriate for a particular shipper. Moreover, inserting excessive or even a full load of wafers and foam padding can, in prior art wafer shippers, particularly those with latches on the diagonal corners, cause distortion and/or bowing of the top cover and/or base. This bowing may actually cause a gap between the top cover and base. Such a gap is visually undesirable, may provide a pathway to contamination of the contents, and may further affect the integrity of the container during impact or shock, causing breakage or unlatching. If the shipper is underpacked with foam or other packing material, breakage may occur at limits under normal impact limits. Known prior art wafer carriers have provided no ready assistance in identifying an appropriate range of foam and wafer stacked thickness which is optimal for providing security to the wafers. Similarly the stacked wafer shippers with the latches on the diagonally opposite corners have provided no means to minimize the visibility of the gap at the sides of the shipper when the shipper is fully loaded or slightly overloaded. Moreover, these prior art shippers have inadequately provided structural means to the base and top cover to provide rigidity and minimize said bowing and gaps at the interface.

SUMMARY OF THE INVENTION

A wafer shipper for stacked wafers provides significantly improved resistance to shock and impact as well as flexibility and tolerance in wafer capacities and guidance in optimal amount of packing material. These characteristics are provided by unique structural configurations that provide rigidity and desirable distribution of impact forces. The shipper has a base and a top cover both of which have a nominal wall that primarily forms all of the features of the respective components. The base has four sides, four corners, and arcuate wall segments defining a wafer stack pocket. The sides are formed of a downwardly extending nominal wall portion and an upwardly extending lip. Both adjoin a nominal base wall which includes a planar bearing surface that extends around the base, outside the arcuate wall segments, and forms a seat for the top cover. The planar bearing surface adjoins the arcuate wall segments and also adjoins the upright stop portions which are part of four shoulders positioned at the corners of the base. Each of said shoulders extends to the side wall. Channels formed from the nominal base wall extend downwardly from the floor of the wafer stack pocket. The channels extend primarily radially or chordially.

The top cover has a continuous nominal side wall extending around the four sides. The sides adjoin the top cover top wall which includes recessed nominal wall structure providing rigidity to the top cover, as well as the stack top engagement surfaces. Four ears extend outwardly at the corners and include oversided latch slots recessed structure and latch retention means. An upper lip at the top cover perimeter extends upwardly and is sized slightly less than the downwardly extending wall of the base so that several shippers may be stacked.

A feature and advantage of particular embodiments of the invention is the unique form fit whereby impact forces that are received on the corners and/or sides of the top cover are transferred to the base through the top cover to upright portions on the opposite side of the base from where the impact occurs. There is not a direct horizontal shock conduit from the corners or sides of the top cover to the adjacent portions on the base. This provides a significant improvement in the robustness of the container as well as significant improvement in the protection provided to the wafers, as well as much better resistance to unlatching upon such impact.

A further feature and advantage of particular embodiments of the invention, an additional concentric set of arcuate wall segments of a lesser diameter are provided. These may cooperated with the first set of arcuate wall segments to provide a double wall for additional strength for resisting fracturing or damage to the wafers during occurrences such as dropping. Moreover, said second wall can be utilized to make a mold for molding a wafer carrier for a first size of wafers convertible into a mold for molding wafer carriers for a second sized of wafers, said second size smaller than the first. The convertible feature can be added by forming the appropriate concentric slots in the mold for the wafer carrier for the first size. Said appropriate concentric slots, are sized for the second size wafers. Suitably sized blanks may be inserted in said slots when the mold is to be used for the first size wafer carrier and the blanks may be removed when the mold is utilized for the second size. More broadly stated a mold for a wafer carrier can utilize separate inserts for converting from a first size pocket to a second size pocket.

A feature and advantage of the invention is that a single mold can be utilized for different carriers for carrying different size wafers. Moreover such a mold will provide a single footprint. Such a single footprint will facilitate automated handling with less changeover of equipment when wafer sizes are changed. Such a single footprint will allow stacking of carriers for different size wafers in a single stack. Moreover, shipping such single footprint carriers will be easier and less expensive in that packaging and cushioning material, which is often specifically sized for a particular carrier, is more universal.

A feature and advantage of particular embodiments of the invention is that it is easier to mold than other prior art wafer carriers that have structural rigidity members. Conventional ribs cause shrinking problems.

A further feature and advantage of particular embodiments of the invention is that the nominal wall rigidity members also are utilized to create a pocket for memory disks, either 3½ floppy disks or CD's.

A further feature and advantage of particular embodiments of the invention is that radial channels formed from the nominal wall provide significantly better resistance to twisting of the components and particularly the base.

A further feature and advantage of particular embodiments of the invention is that a labyrinth seal is provided along the sides of the assembled shipper at the interface between the top cover and the base.

A feature and advantage of particular embodiments of the invention is that the latching arm extending from the base has a horizontal component to provide greater elongation capabilities of said arm. Such provides a latching force that remains consistent under a wider range of loads than conventional latching arms that extend directly and only vertically from the base. That is, the spring constant is effective over a greater distance that conventional latch arms.

A feature and advantage of particular embodiments of the invention is that the nominal wall is utilized for providing structural rigidity rather than ribs. The nominal wall is configured into straight channels rather than circular channels concentric with the wafer pocket that are known in the art. The straight channels are oriented radially or chordially on the base and top cover. Where there are multiple fastening locations connecting the base to the top cover, for example four or more, that are circumferentially spaced around the wafer pocket, the concentric circular channels are appropriate. However, where there are two fastening locations positioned diagonally across from each other at the corners of the base and top cover, the structural rigidity and resistant to twisting of the base appear to be significantly improved when the radially and/or chordially extending channels are utilized.

A further feature and advantage of particular embodiments of the invention is that sidewall extending from the top cover has a single nominal wall with a shape, from the plan view, having four straight sidewalls and abbreviated corners that have inwardly extending channels. Such a configuration provides a significantly greater rigidity than conventional simple shapes, cylindrical or square, and utilizes substantially less material that double reinforced walls known in the art.

A further feature and advantage of particular embodiments of the invention is that same is easier to mold consistently and utilizes significantly less material than prior art stacked wafer shippers.

BRIEF DESCRIPTION OF THE DRAWINGS

FIG. 1 is a perspective view of a prior art wafer carrier for carrying a stack of wafers.

FIG. 2 is a perspective view of a base of a prior art wafer carrier.

FIG. 3 is a perspective view of a top cover of a prior art wafer carrier.

FIG. 6c is a perspective view of the invention herein with a stack of wafers and cushions.

DETAILED DESCRIPTION OF PREFERRED EMBODIMENTS

Figure 4:
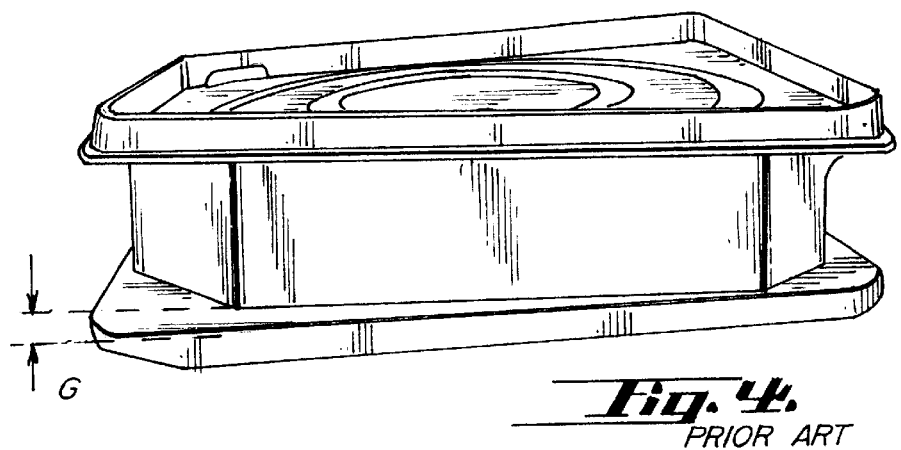
FIG. 4 is a perspective view of a prior art wafer carrier illustrating bowing stability issues.

Referring to FIGS. 5, 6, 7, 8, 9, 10, 11 and 12, various perspective views of a wafer shipper comprised of two cooperating portions configured as a base 202 and a top cover 204. The top cover and base meet at an interface 206 and are secured by latch mechanisms 207.

Referring to FIGS. 6, 7, 8, and 11, the base has a plurality of arcuate lateral wafer support segments 208 which extend from a planar portion 210 of the base and define the wafer stack pocket 212. A floor 211 is positioned at the bottom of the pocket. The planar portion constitutes a seat and bearing surface for the top cover edge. A side wall 214 extends around the periphery 214 of the base. Nominal wall structures 216, 218, 200 in the pocket floor provide structural rigidity to the base by providing undulating attachment positions 221 between said floor and each wafer support sidewall segment. The radially extending structures formed from the nominal wall structure are comprised of a plurality of channels 222 which extend from the pocket floor downward.

Figure 5:
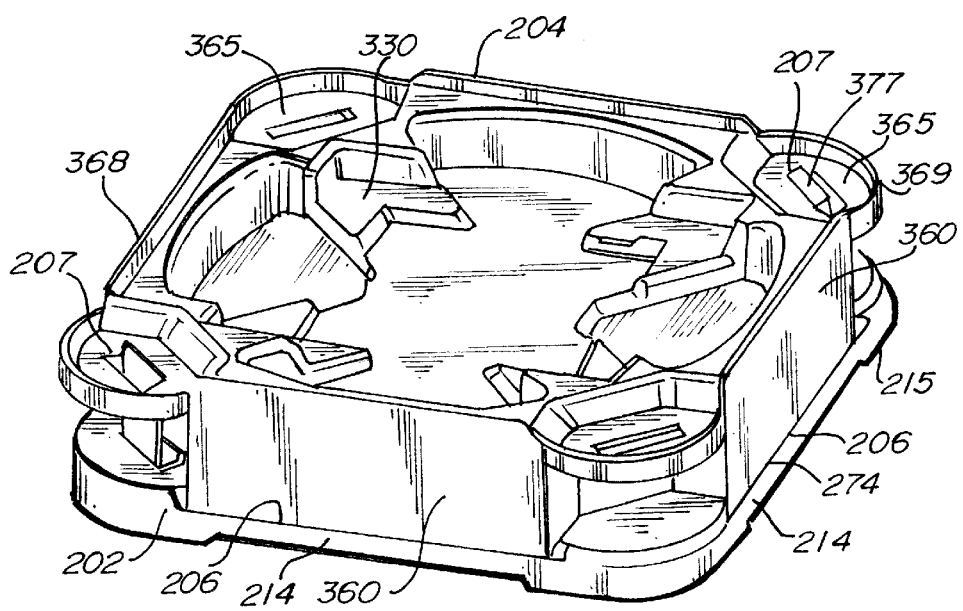
FIG. 5 is a perspective view of a wafer carrier in accordance with the invention herein.
Figure 8:
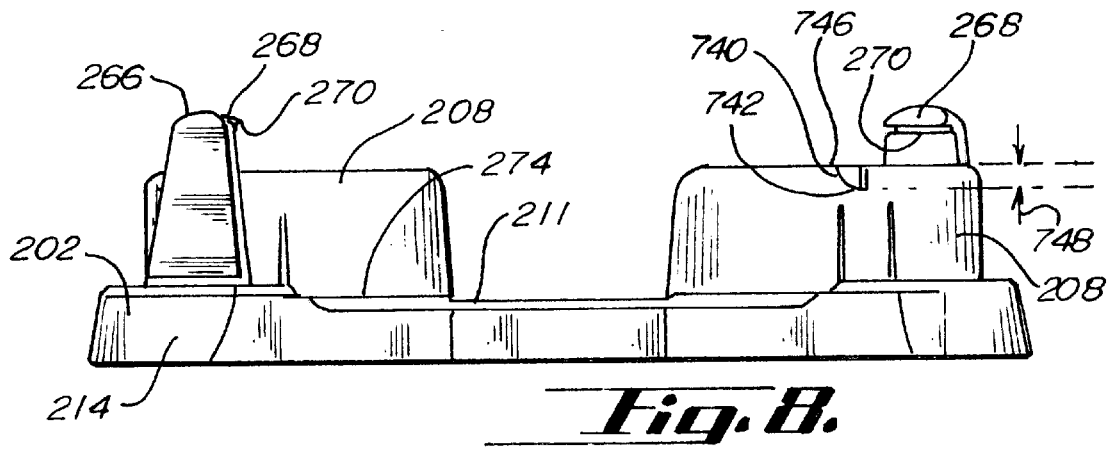
FIG. 8 is a side elevation view of the base of a wafer carrier in accordance with the invention herein.
Figure 9:
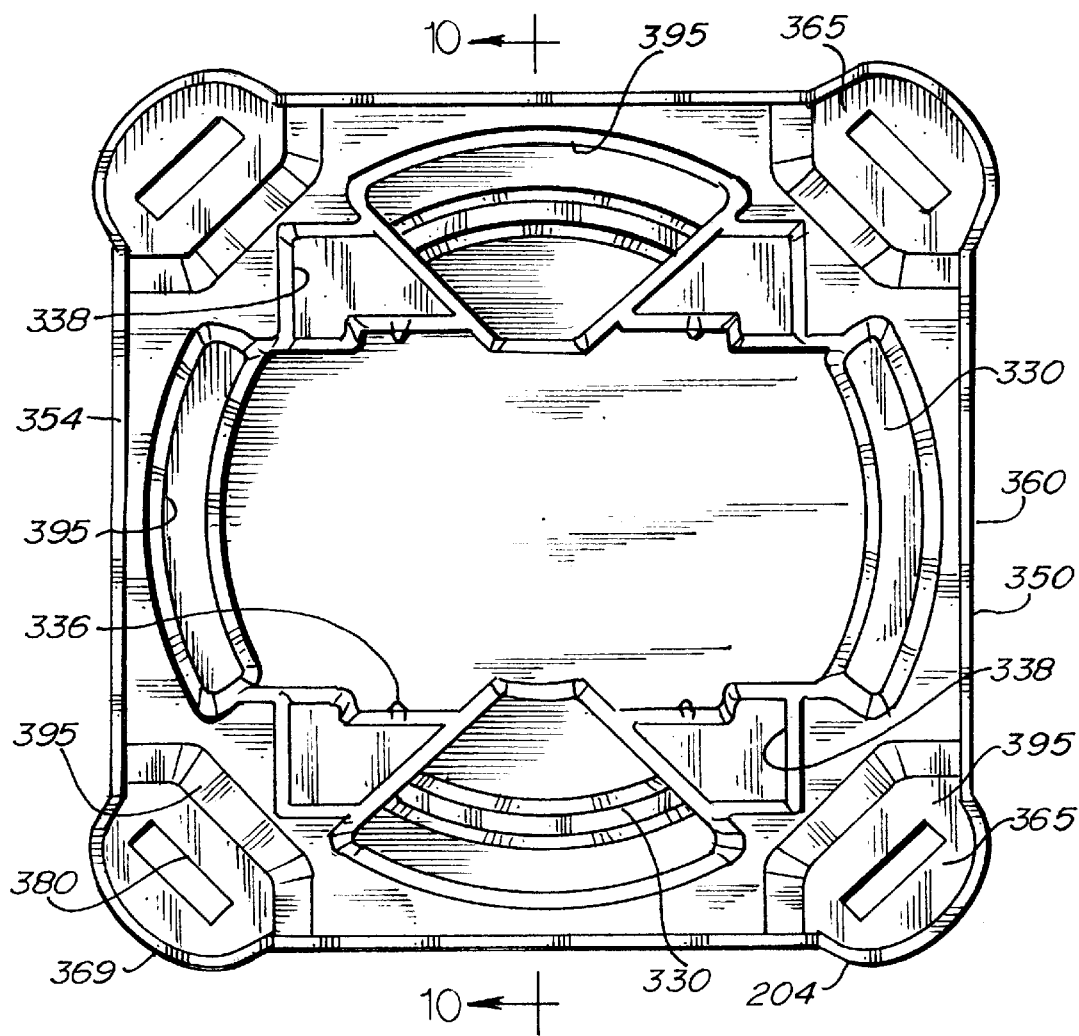
FIG. 9 is a top plan view of a top cover of a wafer carrier in accordance with the invention herein.
Figure 10:
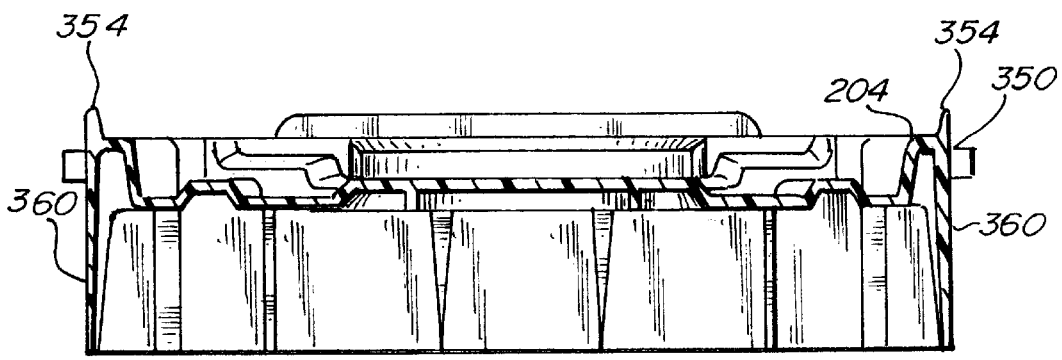
FIG. 10 is a cross-sectional view taken at line 10—10 of FIG. 9.
Figure 12:
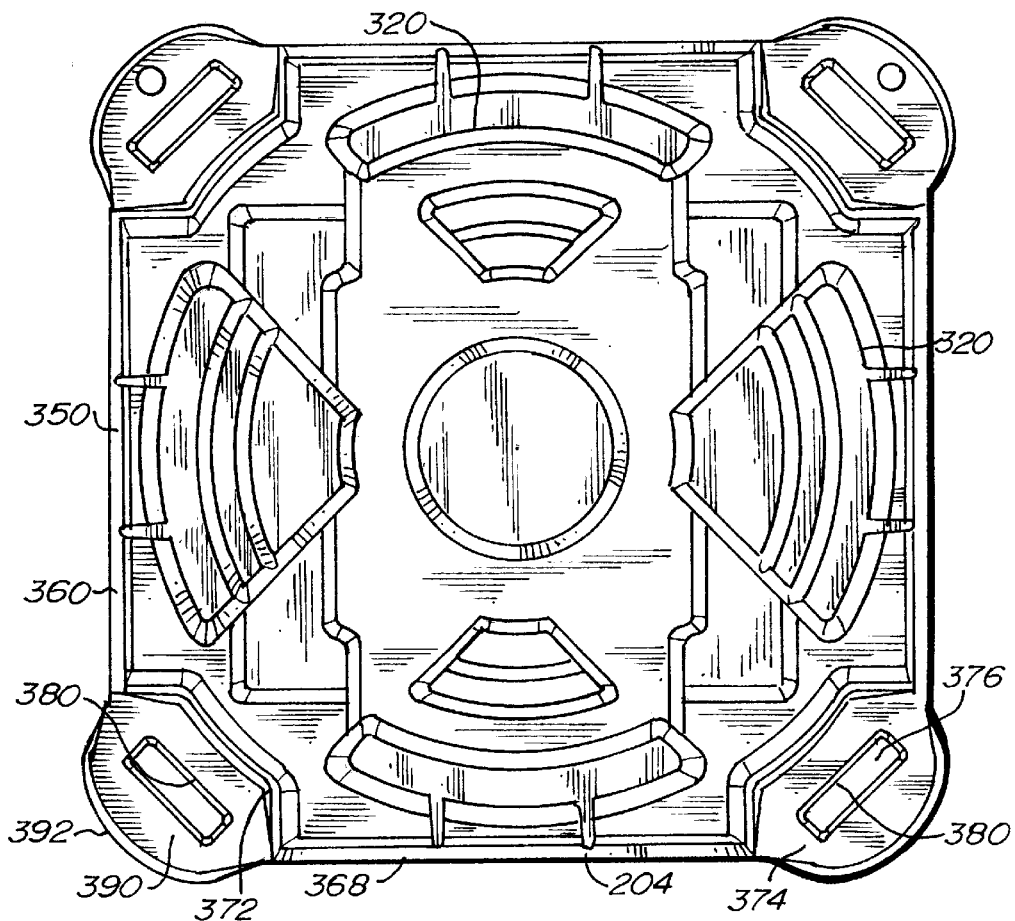
FIG. 12 is a bottom plan view of the top cover of a wafer carrier in accordance with the invention herein.
Figure 11:
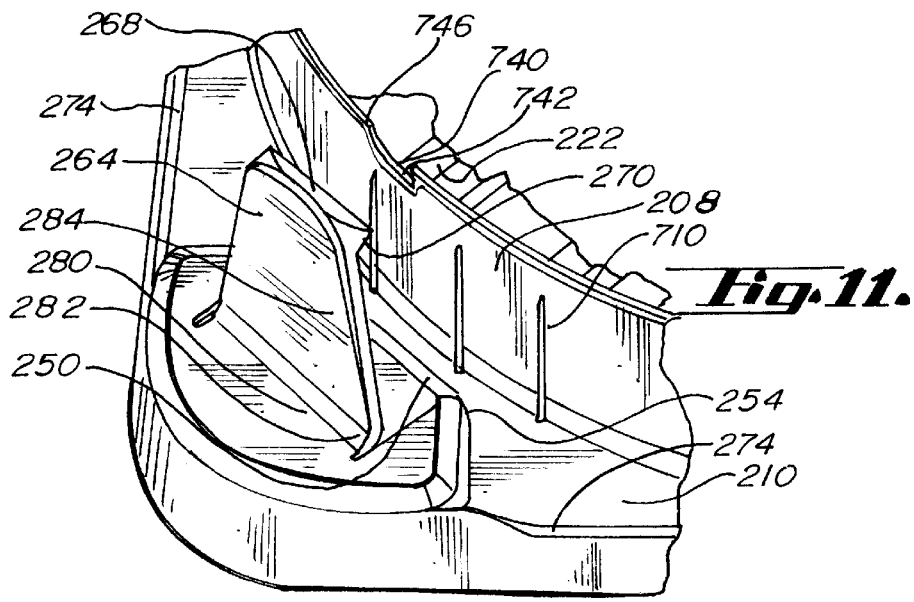
FIG. 11 is a perspective view of a corner of a base of a wafer carrier in accordance with the invention herein.

Referring to FIGS. 5, 8, and 11, various perspective views of corners of the base portion are depicted. The planar surface 210, which constitutes a bearing surface for the top cover edge, extends around the lateral wafer support segments 208. Extending upwardly from the planar surface 210 is a protruding structure configured as a shoulder 250. The shoulder includes an upright surface 254, which operates as an outer constraint to the top cover 204 primarily during impact or other stressing.

Extending from two of the four corners of the base are latching members 264. Latching members include a hook portion 266 with a cam surface 268 and an engagement surface 270. The cam surface deflects the latching member when the top cover is lowered into the latching position and snaps into place with the surface 270 engaged with top surface of the top cover. Significantly, the latching arm has a horizontal extending section 280 and a curved portion 282 extending into an upright portion 284. The horizontal portion reduces the spring constant of the latching member in the vertical direction by allowing up and down flex of said member. This compares to conventional wafer carriers with latches that do not include said horizontal member that have a spring constant in the vertical direction that equates to the spring constant of the material and any flex in the base where it is attached. This horizontal portion effectively extends the positions where the top cover may be fixed in position. Moreover, it softens the downward pull of the top cover toward the base, which allows greater shock absorption during impact, such as dropping of the shipper. Said shock absorption can prevent further damage to the wafers and prevent damage to the shipper that would otherwise occur.

Also depicted in FIGS. 5, 6, 8, and 11 is a lip 274 that extends upwardly from the planar surface 210. Said lip provides an additional impact surface for the top cover discussed in detail below.

Figure 21:
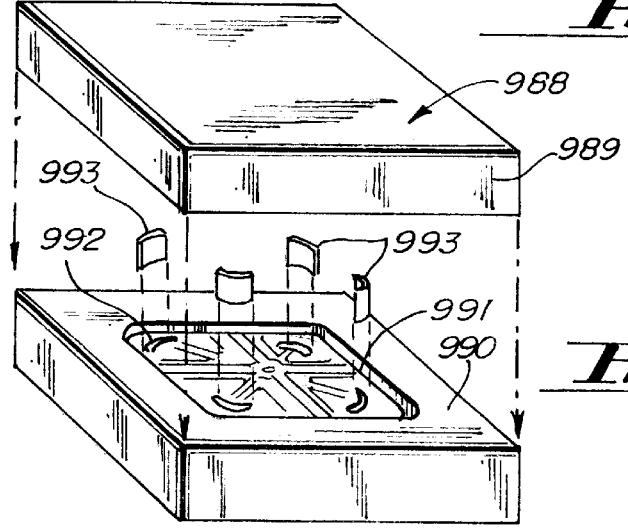
FIG. 21 is a perspective view of a convertible mold with inserts for converting the mold between a mold for a carrier with a wafer pocket of a first size to a mold with a wafer pocket of a second size.

Referring to FIGS. 5, 9, 10, and 12, various views of the second part or top cover are depicted. The significant features include a nominal wall 320 that comprises the vast majority of said top cover, including various stiffening structure 330. Referring to FIG. 21, the nominal wall is configured to provide a pocket 336 for a 3½ inch diskette and a larger pocket 338, sized for a CD case. The top cover has a periphery 350 that includes an upwardly extending lip 354 that follows the periphery. Said lip adds to the structural rigidity and provides a stacking means. Four planar sidewalls 360 extend downwardly from the upper lip 350 and along with inset corner portions 365, define a wafer enclosure. The wafer enclosure perimeter 368 is generally square in shape with the corners 369 inset with an expanded channel shape, as indicated by the numeral 372. At each corner 369 is a flange portion 374 with apertures 376 to receive the head 377 of the latch member. The aperture is defined in part by cam surface 380 to engage the inclined surface at the top of the latch member. The flanges have a planar portion 390 and a lip portion 392, which in combination provide significant rigidity to the corner portions. The significant downwardly extending structure 395 from the top cover in conjunction with the sidewalls 360 provide a top cover that is highly rigid, even when formed with such soft plastics as polypropylene.

Figure 13:
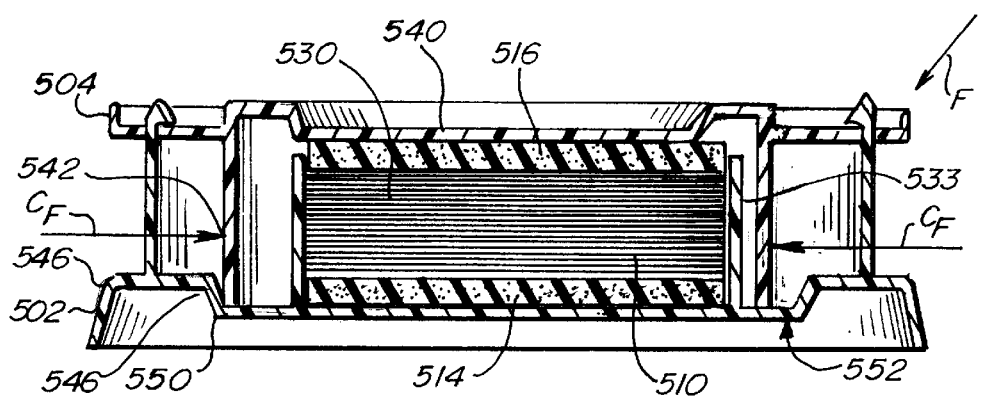
FIG. 13 is a cross-sectional view of a wafer carrier in accordance with the invention herein, illustrating the shock absorption characteristics.

Referring to FIG. 13, one aspect of the cooperation of the top cover with the base is illustrated. The base 502 is engaged with the top cover 504 and contains a stack 510 of wafers. The stack of wafers is cushioned at its bottom by polyurethane foam cushion 514, and at its top by a circular-shaped polyurethane cushion 516. Intermediate the wafers are sheets of separating material 530. When, due to a drop or similar occurrence, a shock is exerted on the top cover, such as indicated by the arrow F, the force of such shock is transmitted through the top cover 540 and sidewalls 542 and is ultimately transferred to the base 502 by the engagement of the sidewall 542 with the shoulder 546 of the base. The engagement point is indicated by the region designated 550. This is located on the opposite side of the wafer shipper from the point of force. This dispersion of the force through the top portion and sidewalls effectively transfers the impact force around the stack of wafers, thereby protecting said wafers. Note that there is illustrated the engagement at region 550 there remains a gap at region 552. The planar surface and gap between the shoulders and lateral sidewall segments are appropriately configured to provide this force transfer effect. With sufficient force the gap at region 552 will close.

Figure 6:
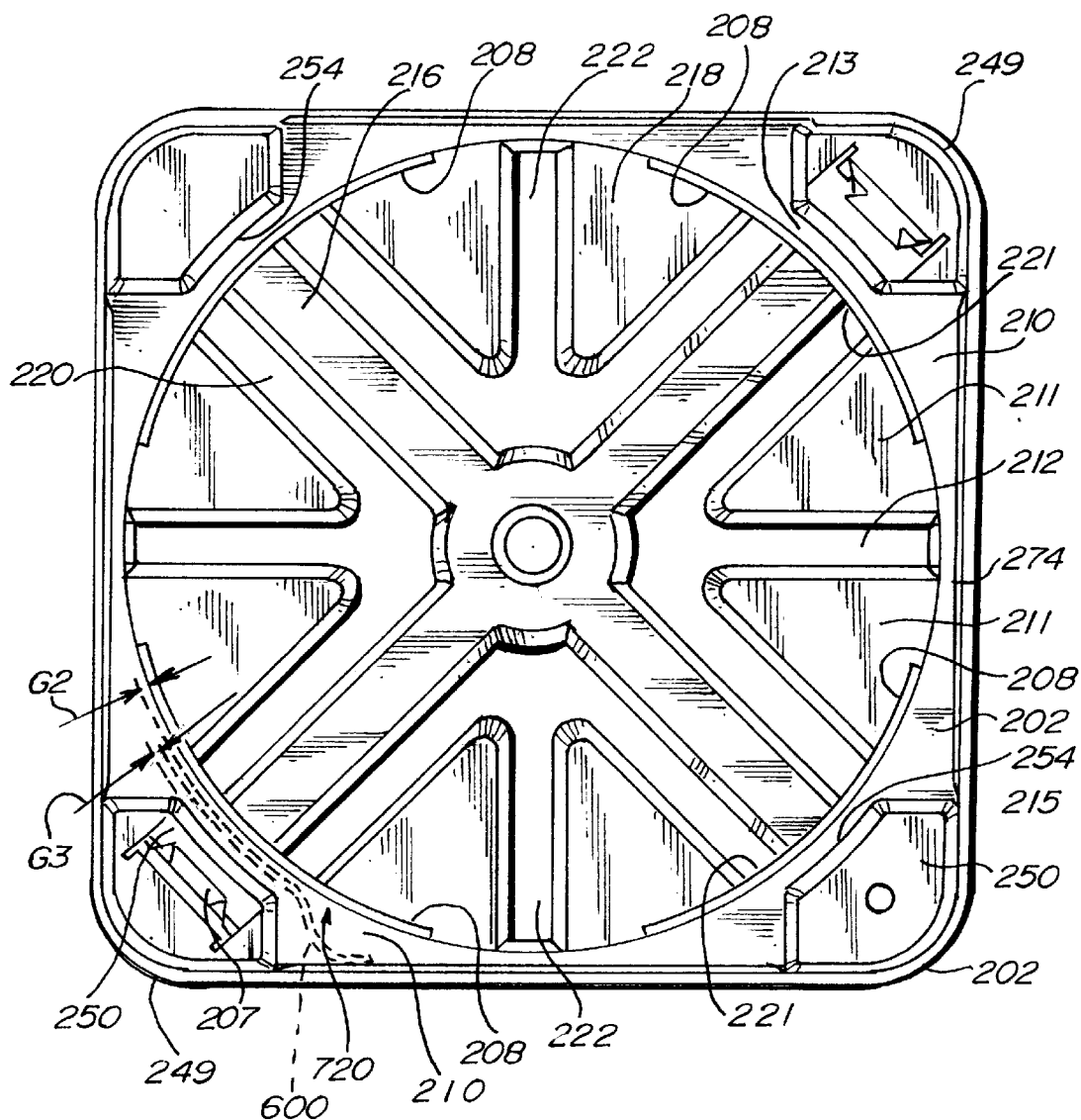
FIG. 6 is a top plan view of a base of a wafer carrier in accordance with the invention herein.
Figure 6B:
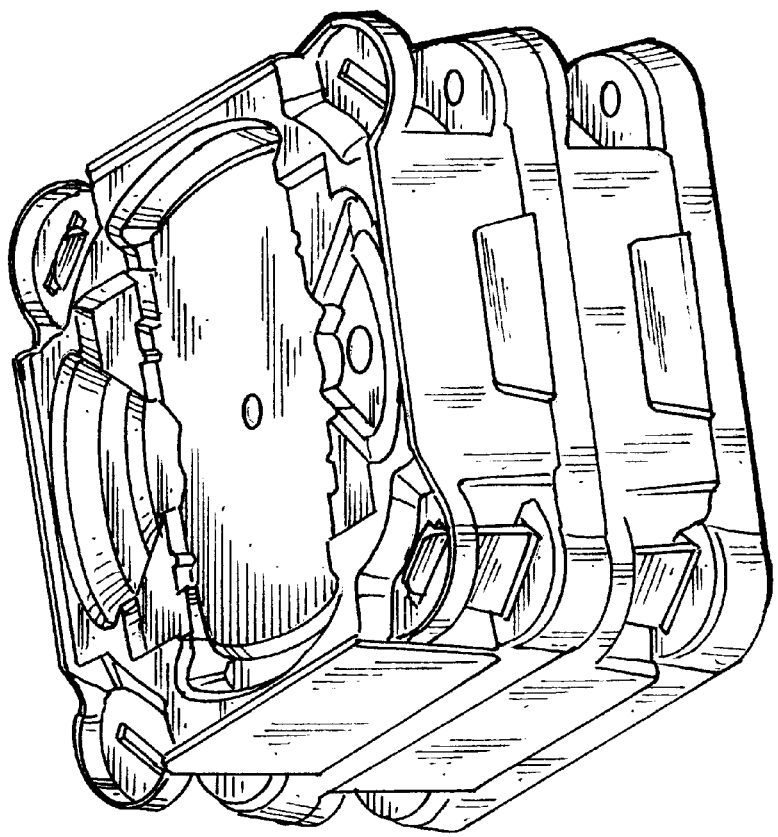
FIG. 6b is an illustration of stacking units of the invention herein.
Figure 6A:
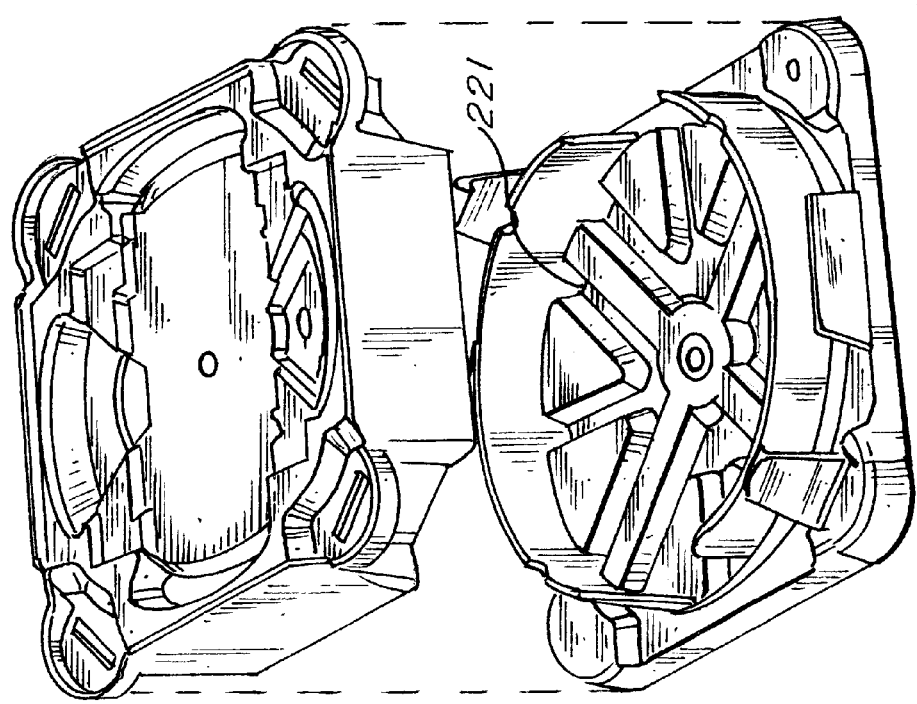
FIG. 6a is an illustration of the invention herein showing an alignment of the top cover and base.
Figure 7:
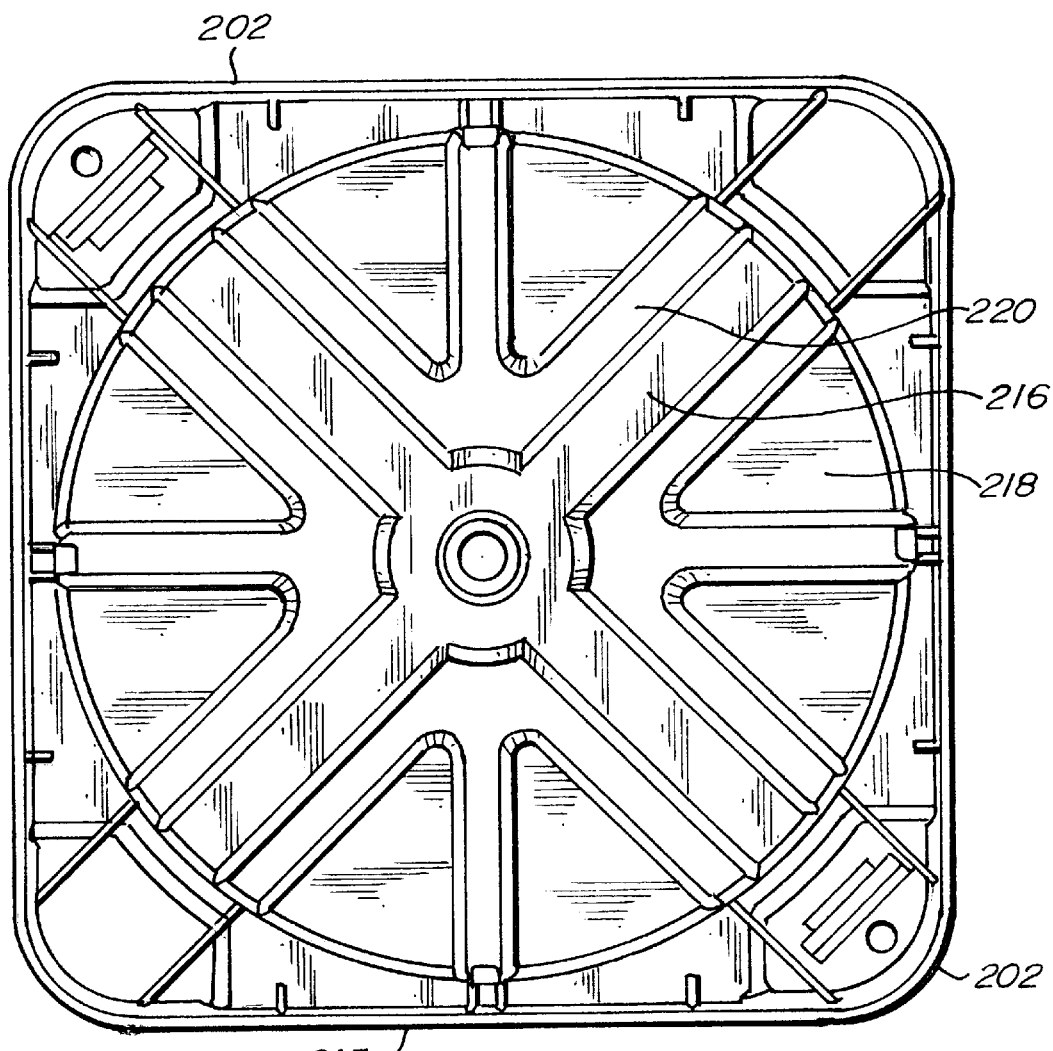
FIG. 7 is a bottom plan view of a base of a wafer carrier in accordance with the invention herein.

Referring to FIG. 6, the normal position of the top cover on the planar surface is indicated by the dashed lines labeled with the numeral 600. The effect is accomplished in part by having the gap indicated by G2 between the lateral wall segment and the top cover sidewall be greater than the gap G3 between the wall of the top cover and the engagement surface of the shoulder 250. Where the impact force is of sufficient magnitude, the top cover sidewall will engage the shoulder opposite the point of impact first, and then the top cover sidewall adjacent the region of impact will subsequently engage the base of the lateral wafer support sidewall segment or other structure extending upwardly from the planar surface as may be suitable. Thus, it is noted that the planar surface 210 effectively operates as a bearing surface for the edge surface of the top cover downwardly extending wall. Also, due to the fact that under all but extraordinary conditions, the top cover will not contact the lateral wafer support segments 208. Additional strengthening ribs 710 as shown in FIG. 11 may be added in the region indicated by the arrow 720. FIG. 6 additional support ribs may be added without the potential for contact with the top cover sidewall, due to the shift in the sidewall at this location.

Referring to FIGS. 8 and 11, a portion of the lateral wafer support wall has structure 740 which is configured to provide visual indicators to provide a range of appropriate or optimal load height, including cushions. This reference has two horizontal surfaces labeled 742 and 746, which define a range 748 wherein the wafers and cushions may suitably extend.

Figure 14:
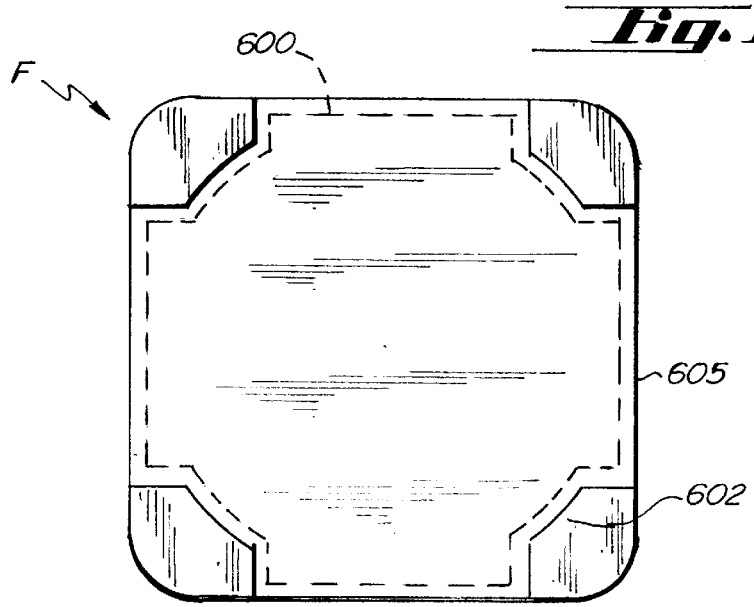
FIG. 14 is a plan view of a base of a wafer carrier in accordance with the invention herein, illustrating the normal seating position of the top cover of the wafer carrier therewith.

The embodiments herein provide a container for stacked wafers wherein the base and top cover provides a secure latching mechanism, provides a wider range of the numbers of wafers that can optimally be carried and quantity of spaces and cushioning material that resists impacts and effectively isolates the wafers from such impacts, that is highly suitable to robotic operation, that provides effective sealing of the wafers, that resists bowing and base instability, and that receives memory disks in part of the top cover reinforcing region. Referring to FIG. 14 a plan view of the engagement of the bearing surfaces of the top cover and the base at an unstressed state are illustrated with the gaps exaggerated. With F acting on the corner of the top cover (not shown) the transfer of the force to the base will be at the base opposite the corner receiving the force, and will be principally at the shoulder 602. Note that at the sides of the base a lip 605 may extend upwardly to provide a supplemental or alternative engagement member for receiving forces on the opposite side of the shipper.

Figure 15:
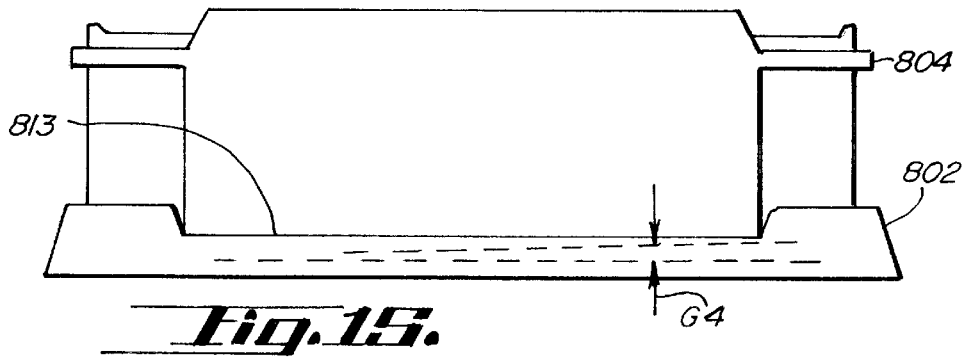
FIG. 15 is a side elevation view of a wafer shipper according to the invention herein, illustrating the labyrinth seal and peripheral lip of the base.
Figure 17:
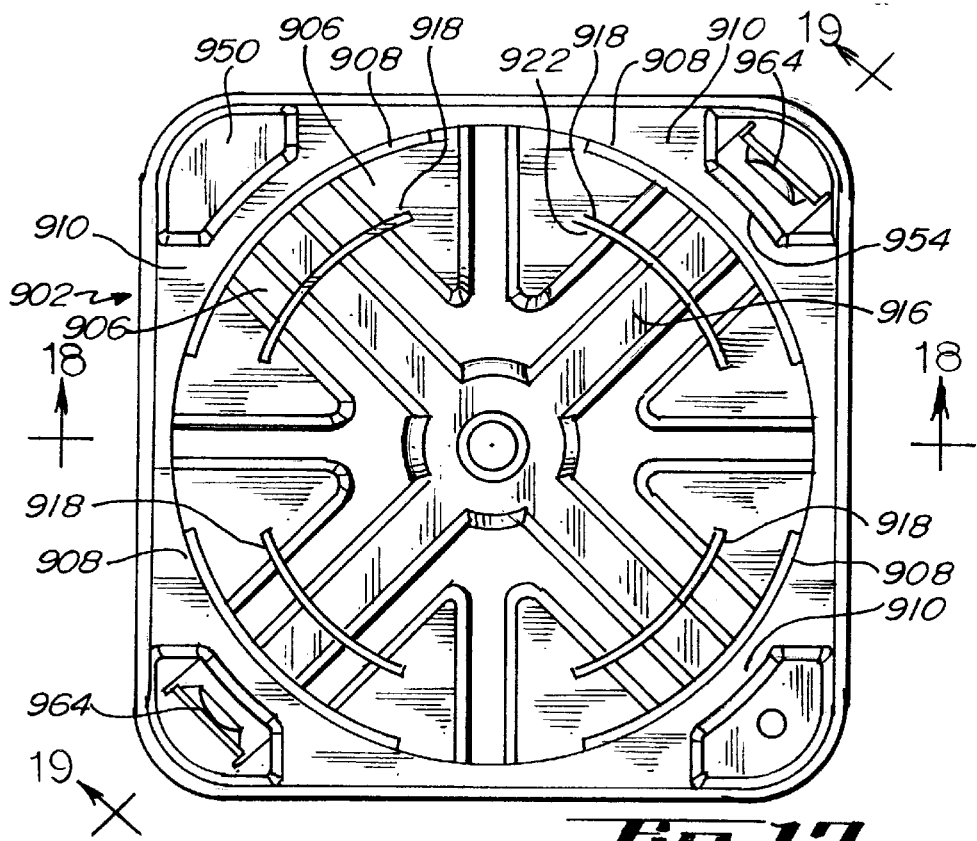
FIG. 17 is a top plan view of an alternative embodiment of the wafer carrier in accordance with the invention herein.
Figure 18:
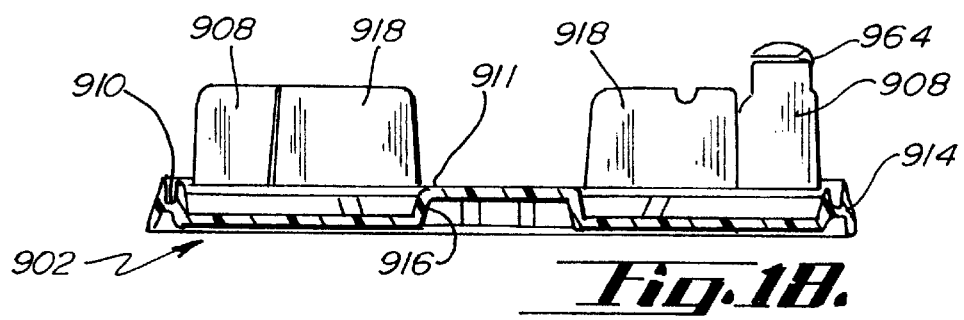
FIG. 18 is a side elevation view of an alternative embodiment of the wafer carrier in accordance with the invention herein.
Figure 16:
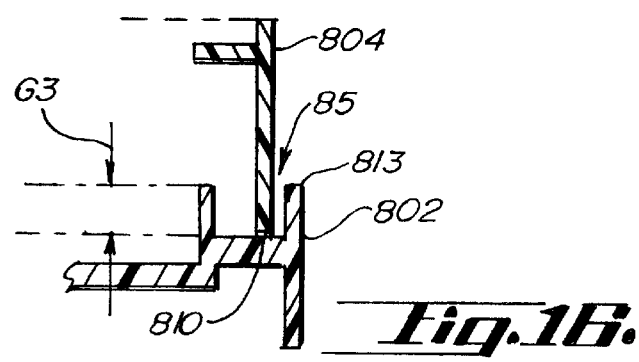
FIG. 16 is a cross-sectional view of a wafer carrier in accordance with the invention herein, illustrating the labyrinth seal and peripheral lip of the base.
Figure 20:
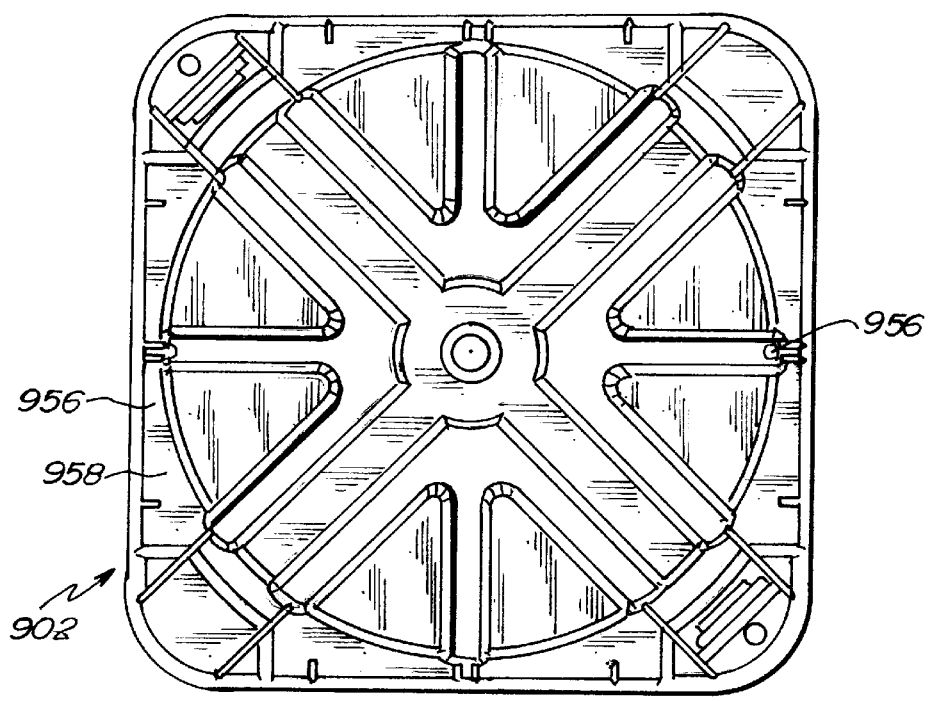
FIG. 20 is a bottom plan view of a base of an alternative embodiment of the wafer carrier in accordance with the invention herein.
Figure 19:
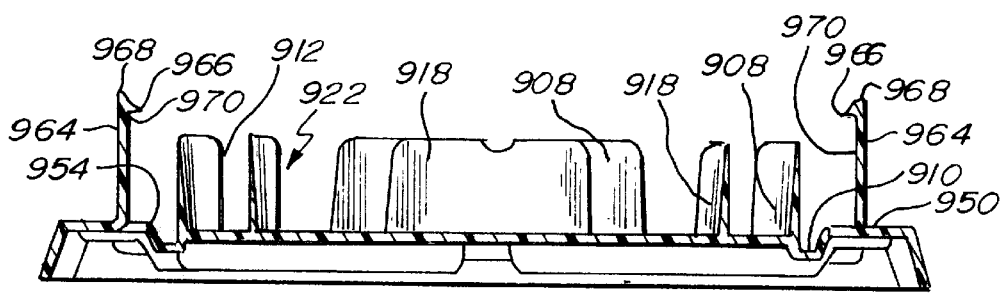
FIG. 19 is a cross-sectional side view of an alternative embodiment of the wafer carrier in accordance with the invention herein.

Referring to FIGS. 15 and 16, a further feature of the invention is illustrated. Although the structural configuration disclosed above will reduce or minimize distortion of the top cover 804 and base 802 compare to prior art FIG. 11) to the extent that some twisting of the top cover occurs which causes disengagement of the top cover lower edge 810 with the seat 812, the peripheral lip 813 keeps the uplifted edge below the top of said lip 813 thus maintaining a labyrinth path 815 into the wafer pocket and eliminating visual exposure of the gap G4.

Referring to FIGS. 17, 18, 19 and 20, an alternative embodiment of the wafer carrier is illustrated. The wafer carrier has a first plurality of arcuate lateral wafer support segments 908 that extend from the base 902 and define a first wafer stack pocket 912. The first wafer stack pocket 912 is substantially symmetrical about a central axis 914. A diameter of the first wafer stack pocket 912 is preferably about 8 inches.

The wafer carrier also includes a second plurality of arcuate lateral wafer support segments 918 that extend from the base 902 and define a second wafer stack pocket 922. The second wafer stack pocket 922 is substantially symmetrical about the central axis 914. A diameter of the second wafer stack pocket 922 is preferably about 6 inches. Providing the second wafer stack pocket 922 within the first wafer stack pocket 912 further enhances the ability of the wafer carrier of the present invention to protect wafers placed in the wafer carrier from damage caused by external forces placed on the wafer carrier.

Each of the arcuate lateral wafer support segments 918 are preferably aligned with one of the arcuate lateral wafer support segments 908. The arcuate lateral wafer support segments 918 are located between the arcuate lateral wafer support segments 908 and the central axis 914.

A side wall 914 extends around the periphery 914 of the base 902. Nominal wall structures 916 in the pocket floor 911 provide structural rigidity to the base 902 by providing undulating attachment positions between the floor 911 and each wafer support segment 908.

The base 902 has a bearing surface 910 and a shoulder 950 that extends upwardly from the bearing surface 910. The shoulder 950 has an upright surface 954 that operates as an outer constraint to the top cover 904 during impact or when other similar stresses are exerted upon the wafer carrier.

What is claimed is:

1. A wafer carrier for carrying a plurality of stacked wafers, the carrier comprising:
    a cover comprising a generally horizontal top portion having four corners and four sidewall portions extending downwardly from the horizontal top portion, each of the four corners having a downwardly facing bearing surface, an inward facing surface, and an outward facing surface; and
    a base comprising a generally horizontal bottom portion having four corners, a perimeter, at least one wafer support portion defining a pocket for receiving the stack of wafers, four upwardly extending shoulder portions positioned outwardly of the at least one wafer support portion at the corners of the base, and an upwardly facing bearing surface positioned intermediate each of the shoulder portions and the at least one wafer support portion for operably receiving the downwardly facing bearing surface of the cover.

2. The wafer carrier of claim 1, wherein the four upwardly extending shoulder portions and the bearing surfaces are configured such that a force having a horizontal component acting on the top cover causes an engagement of the outwardly facing surface of the cover with the upwardly extending shoulder portions of the base before engagement of the inward facing surface of the cover with the wafer support portions of the base.

3. The wafer carrier of claim 1, wherein the at least one wafer support portion of the base is arcuate and defines a circular pocket for containing the stack of wafers.

4. The wafer carrier of claim 1, wherein the at least one wafer support portion defines a first circular pocket having a first diameter and a second circular support pocket having a second diameter, wherein the second diameter is greater than the first diameter.

5. The wafer carrier of claim 1, wherein the at least one wafer support portion includes a stacking level indicator.

6. The wafer carrier of claim 5, wherein the stacking level indicator is a notch in the at least one wafer support portion.

7. The wafer carrier of claim 1, wherein the base further includes a plurality of latching members and the cover further includes a plurality of apertures configured to receive the latching members therethrough.

8. The wafer carrier of claim 7, wherein the latching members have a horizontal portion extending horizontally inwardly, a vertical portion extending upwardly, and an engagement portion, wherein the engagement portion is configured to engage the apertures of the cover, thereby releasably securing the base to the cover.

9. The wafer carrier of claim 8, wherein each latching member adjoins the base along the horizontal portion.

10. The wafer carrier of claim 1, wherein the base further includes a lip extending upwardly along the perimeter.

11. The wafer carrier of claim 10, wherein the lip extends upwardly to a height sufficient to conceal a gap formed between the downwardly facing bearing surface of the cover and the upwardly facing bearing surface of the base, the lip forming a labyrinth seal with the downwardly facing bearing surface and the upwardly facing bearing surface.

12. The wafer carrier of claim 1, wherein at least one of said cover and base further includes a plurality of nominal wall channels formed therein for rigidity, the wall channels being linear and directed in at least one of a radially or chordially direction.

13. The wafer carrier of claim 1, wherein the cover further includes a pocket portion in the horizontal top portion configured to receive a data storage media.

14. The wafer carrier of claim 13, wherein the data storage media is a 3.5 inch diskette.

15. The wafer carrier of claim 13, wherein the data storage media is a compact disc in a jewel case.

16. The wafer carrier of claim 1, wherein at least one of the cover and base further includes a nominal wall forming straight channels to provide resistance to twisting.

17. A wafer shipper for carrying a plurality of stacked wafers and cushions, the wafer shipper comprising:

a cover comprising a generally horizontal top portion having four corners and four sidewall portions extending downwardly from the horizontal portion, each of the four corners having a downwardly facing bearing surface; and a base comprising a generally horizontal bottom portion having a pocket for receiving the stack of wafers and cushions, at least one arcuate wafer support portion, upwardly extending shoulder portions positioned outwardly of the at least one arcuate wafer support portion, and an upwardly facing bearing surface positioned intermediate each of the shoulder portions and the at least one arcuate wafer support portion for operably receiving the downwardly facing bearing surfaces of the cover, wherein the at least one arcuate wafer support portion includes a stacking level indicator.

18. The wafer shipper of claim 17, wherein the stacking level indicator is a notch in the at least one arcuate wafer support portion extending downwardly, the indicator notch defining a range wherein the plurality of wafers and cushions may be suitably stacked.

19. The wafer shipper of claim 17, wherein the cover further includes a pocket portion in the horizontal top portion configured to receive a data storage media.

20. A wafer shipper for carrying a plurality of vertically stacked horizontally oriented wafers, the shipper comprising:

a cover comprising a generally horizontal top portion having four corners and four sidewall portions extending downwardly from the horizontal portion, each of the four corners having a downwardly facing bearing surface; and a base comprising a generally horizontal bottom portion having a pocket for receiving the stack of wafers, at least one wafer support portion, upwardly extending shoulder portions positioned outwardly of the at least one wafer support portion, an upwardly facing bearing surface positioned intermediate each of the shoulder portions and the at least one wafer support portion for operably receiving the downwardly facing bearing surfaces of the cover, wherein at least one of the base and cover includes a plurality of nominal wall channels formed therein for rigidity, the wall channels being linear and directed one of radially, chordially, or both.

21. The wafer shipper of claim 20, wherein the cover further includes a pocket portion in the horizontal top portion configured to receive a data storage media.

* * * * *